United States Patent
Schwarzenbach et al.

(10) Patent No.: US 8,088,671 B2
(45) Date of Patent: Jan. 3, 2012

(54) DEFECTIVITY OF POST THIN LAYER SEPARATION BY MODIFICATION OF ITS SEPARATION ANNEALING

(75) Inventors: Walter Schwarzenbach, Saint Nazaire les Eymes (FR); Nadia Ben Mohamed, Echirolles (FR); Fleur Guittard, Brie et Angonnes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 64 days.

(21) Appl. No.: 12/529,482

(22) PCT Filed: Mar. 18, 2008

(86) PCT No.: PCT/IB2008/000747
§ 371 (c)(1),
(2), (4) Date: Sep. 1, 2009

(87) PCT Pub. No.: WO2008/120079
PCT Pub. Date: Oct. 9, 2008

(65) Prior Publication Data
US 2010/0105217 A1    Apr. 29, 2010

(30) Foreign Application Priority Data
Mar. 29, 2007 (FR) ...................................... 0754135

(51) Int. Cl.
*H01L 21/30* (2006.01)
(52) U.S. Cl. .................. 438/458; 438/455; 257/E21.568
(58) Field of Classification Search .................. 438/455, 438/458, 459, 799
See application file for complete search history.

(56) References Cited

U.S. PATENT DOCUMENTS

| 2004/0161904 A1 | 8/2004 | Berne et al. ................... 438/455 |
| 2004/0241960 A1 | 12/2004 | Maurice et al. ............... 438/458 |
| 2005/0101104 A1 | 5/2005 | Schwarzenbach et al. ... 438/458 |
| 2005/0277267 A1 | 12/2005 | Maurice et al. ............... 438/455 |
| 2007/0111354 A1* | 5/2007 | Seong et al. ..................... 438/46 |

FOREIGN PATENT DOCUMENTS

| EP | 1 482 548 | 12/2004 |
| EP | 1 605 504 | 12/2005 |

OTHER PUBLICATIONS

International Search Report, PCT/IB2008/000747, Mailed Nov. 3, 2008.

* cited by examiner

*Primary Examiner* — Charles Garber
*Assistant Examiner* — Reema Patel
(74) *Attorney, Agent, or Firm* — Winston & Strawn LLP

(57) ABSTRACT

A method of detaching two substrates at the embrittlement zone situated at a given depth of one of the two substrates. The method includes a separation annealing step implemented in a furnace, wherein the annealing includes a first phase during which the temperature changes along an upgrade allowing a high temperature to be reached and annealing at this high temperature to be stabilized, and a second phase during which the temperature changes along a downgrade, at the end of which the furnace is opened to unload the substrates from the furnace. The second phase is regulated so as to minimize temperature inhomogeneities such as cleavage defects at the detached surfaces of the substrates when the furnace is opened.

15 Claims, 3 Drawing Sheets

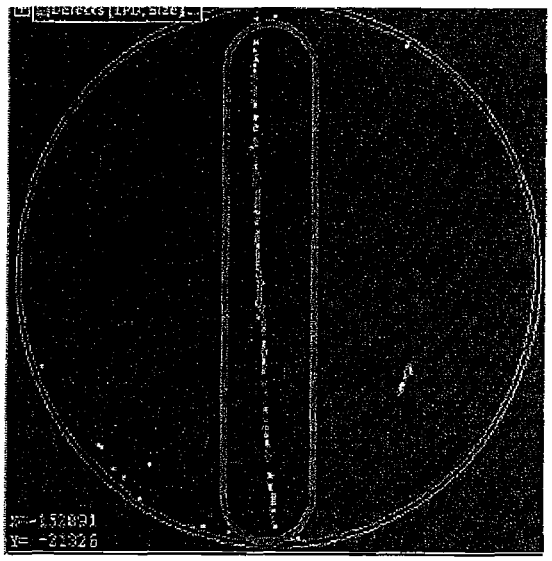
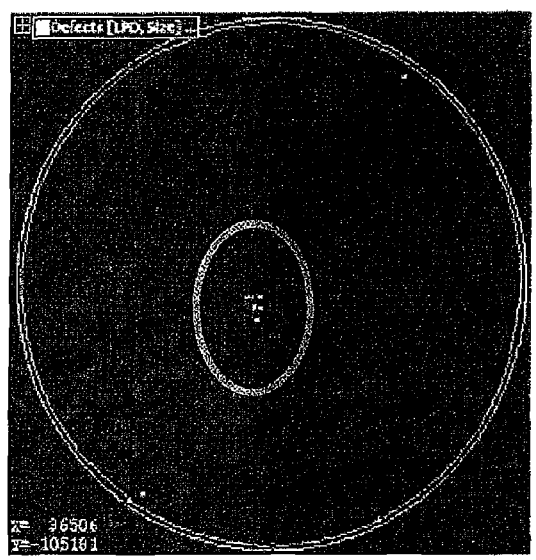
FIG.1a    FIG.1b
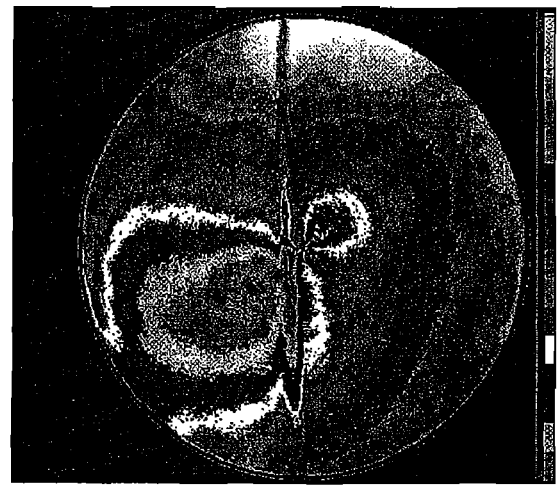
FIG.2

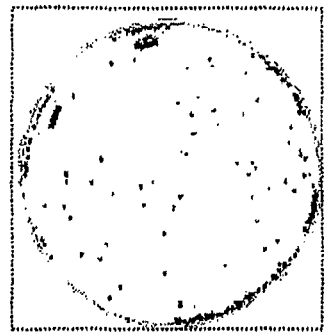
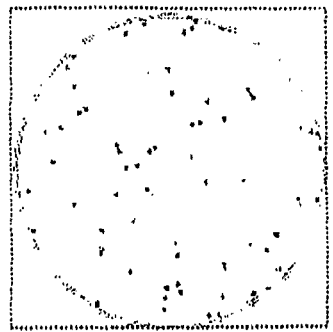
FIG_5a  FIG_5b
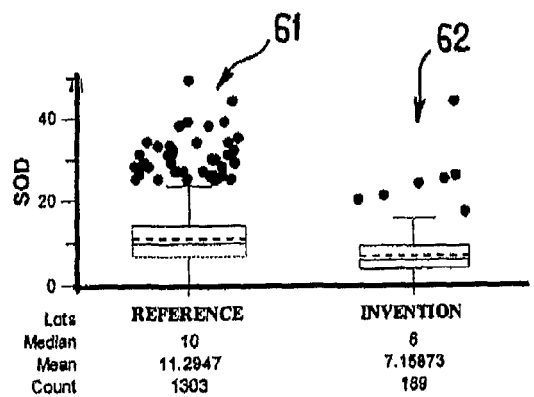
FIG_6a
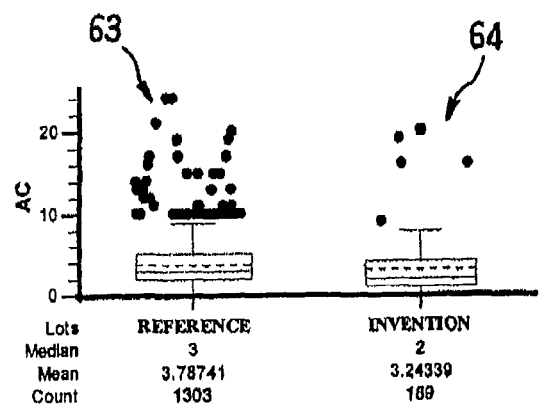
FIG_6b
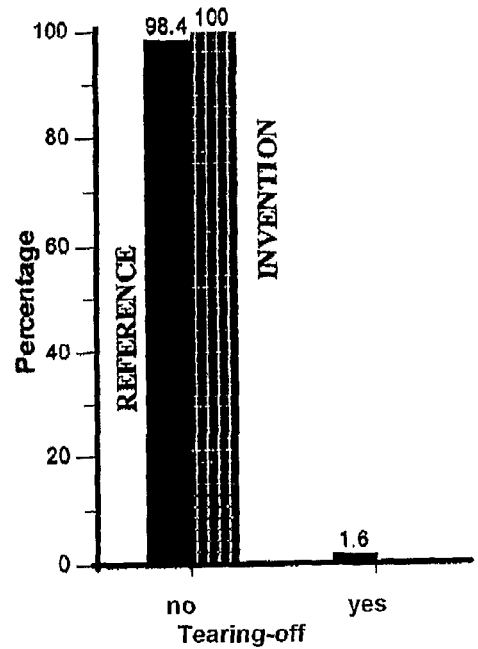
FIG_6c

DEFECTIVITY OF POST THIN LAYER SEPARATION BY MODIFICATION OF ITS SEPARATION ANNEALING

This application is a 371 filing of International Patent Application PCT/IB2008/000747 filed Mar. 18, 2008.

BACKGROUND

The present invention relates to making composite structures for electronics, optics or microelectronics.

More precisely, the invention relates to a method of detaching two substrates at an embrittlement zone situated at a given depth of one of the two substrates, the method comprising a separation annealing step implemented in a furnace, said annealing comprising a first phase during which the temperature changes along an upgrade allowing a high temperature to be reached and stabilizing the annealing at this high temperature, a second phase during which the temperature changes along a downgrade, at the end of which the furnace is opened and then the substrates are unloaded from the furnace.

The invention also relates to a Silicon On Insulator (SOI) type structure obtained by such a method.

Applying such methods to carry out detachment between two substrates, between which an embrittlement surface was defined by implantation, is known.

For example, thermal separation annealing is thus one of the steps in the Smart Cut™ method used to produce SOI type composite structures.

During separation annealing, the SOI surface (buried oxide layer and superficial silicon layer) is transferred from a donor substrate (previously oxidized and implanted) to a receiver substrate (which was bonded to the donor substrate).

At the end of the separation annealing, the donor substrate is detached from the receiver substrate.

Thus, an SOI type structure is obtained, that may also be designated as a "positive substrate" and a "residual substrate;" the residual substrate may be designated as a "negative substrate," and may be recycled.

It is specified that the separation annealing is implemented in a furnace.

After separation annealing, a defect known as a "cleavage line" is sometimes observed.

This defect may be characterized as follows:

the defect appears near the center of the negative substrate;

the defect may cross through the entire thickness of this negative substrate;

the defect propagates by moving along the crystallographic directions of the crystal constituting the negative substrate;

the defect may propagate until a sufficient size to cause breakage of the negative substrate is reached.

Such a "sufficient size" corresponds to the case where the defect propagates on the entire diameter of the substrate and the substrate then "spontaneously" breaks or to the case where the defect sufficiently weakens the substrate so that the substrate breaks during possible mechanical stress.

The appearance of a "cleavage line" defect on the negative substrate does not allow the substrate to be recycled, which corresponds to a loss.

In addition, because the negative substrate is in contact with the positive substrate during separation, the "cleavage line" defect may damage the positive substrate.

In fact, as the two substrates are in close contact, the defect on the negative substrate may lead to the positive substrate being damaged.

This is harmful, since the positive substrate will provide the final SOI structure after annealing.

FIGS. 1a and 1b present maps of defects present on two SOI structures (positive substrate) against which the negative substrate had presented a "cleavage line" defect.

These maps are obtained by using a piece of KLA Tencor SP2 type inspection equipment allowing the final defectivity of the SOI structure to be measured.

In the case of FIG. 1a, the negative substrate presents a complete "cleavage line" defect that led to breakage of the negative substrate. The negative substrate defect is definitely propagated on the SOI structure.

In the case of FIG. 1b, the negative substrate presents the beginning of a "cleavage line" present in the center. In the same way as the case illustrated in FIG. 1a, the defect is also propagated on the SOI structure.

SUMMARY OF THE INVENTION

The present invention proposes mitigating the abovementioned problems and particularly enabling the implementation of separation annealing allowing the "cleavage line" type defect on the positive substrate to be reduced.

For this purpose, the invention proposes a method of detaching two substrates at the embrittlement zone situated at a given depth of one of the two substrates, the method comprising a separation annealing step implemented in a furnace, said annealing comprising a first phase during which the temperature changes along an upgrade allowing a high temperature to be reached and annealing at this high temperature to be stabilized, a second phase during which the temperature changes along a downgrade, at the end of which the furnace is opened, then the substrates are unloaded from the furnace, characterized in that the second phase is regulated so as to minimize temperature inhomogeneities at the surface of the detached substrates when the furnace is opened.

Preferred, but not limiting, aspects of this method are the following the period of the second phase is defined by a duration setting.

during the second phase, the temperature of the furnace is regulated so as to change to a target temperature that is low enough to have not been reached at the end of the second phase, during unloading, the temperature of the substrates is less than 200° C., a gas stream is injected on the substrates according to a fixed rate, this gas may be Nitrogen or Argon, the rate is equal to 12 slm before the furnace is opened and 20 slm at the end of the second phase and during the third phase, the target temperature is on the order of 50° C., the high temperature is on the order of 500° C., during the second phase, the temperature decreases at a rate of 10° C. per minute, the embrittlement zone was made during a Smart Cut™ type method.

In addition, the invention relates to the application of a method of the invention for detaching a substrate whose diameter is equal to or greater than 300 mm.

BRIEF DESCRIPTION OF THE DRAWINGS

Other characteristics and advantages of the invention will further emerge from the following description, which is purely illustrative and non-limiting and must be read with regard to the attached figures in which:

FIGS. 1a and 1b, as previously discussed, present maps of defects present on two SOI structures;

FIG. 2 illustrates a map of the surface roughness expressed in Haze measured by means of a piece of KLA Tencor SP2 inspection equipment on an SOI structure against which the negative substrate presented a "cleavage line" defect, FIGS. 5a and 5b illustrate maps of tearing-off type defects observed at the surface of an SOI after detachment by using conventional annealing and annealing according to the invention respectively, FIGS. 6a, 6b and 6c illustrate diagrams of comparisons between defects observed in an SP2 type measurement between populations of SOI structures obtained with conventional annealing and annealing according to the invention. SOD (defect at 0.15 µm) type defects are presented in FIG. 6a. AC (defect at 0.5 µm) type defects are presented in FIG. 6b. Tearing-off type defects in the center of the structure are presented in FIG. 6c.

DESCRIPTION OF THE INVENTION

Figure 3:
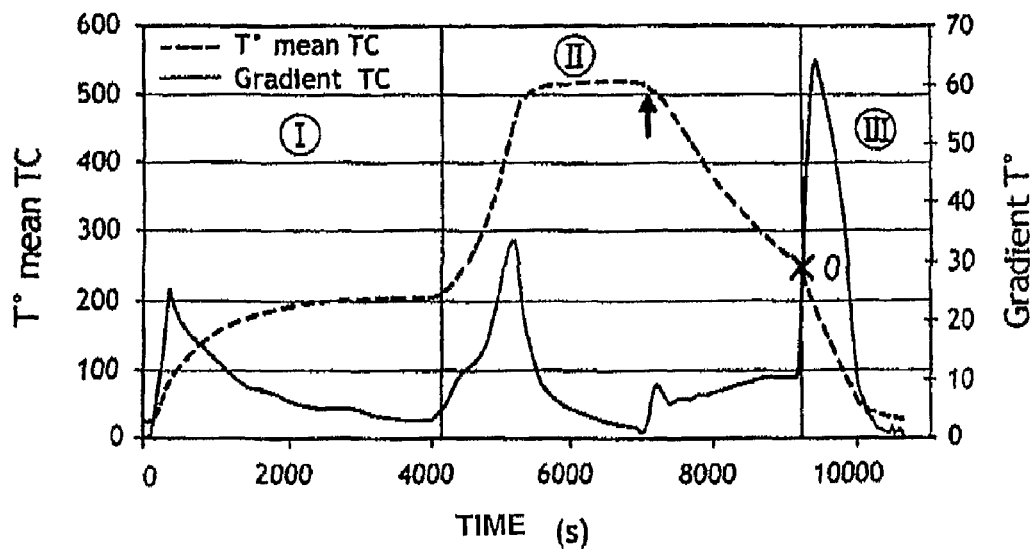
FIG. 3 illustrates the average temperature (dotted lines) measured in a furnace on an SOI structure during conventional separation annealing, as well as the gradient of this temperature (solid lines)

As already mentioned, the invention relates to a method of detaching two substrates at an embrittlement zone situated at a given depth of one of two substrates, the method comprising a separation annealing step implemented in a furnace, said annealing comprising a first phase during which the temperature changes along an upgrade allowing a high temperature to be reached and stabilizing the annealing at this high temperature, a second phase during which the temperature changes along a downgrade, at the end of which the furnace is opened and then the substrates are unloaded from the furnace.

More particularly, the invention aims to prevent the appearance of "cleavage line" type defects.

FIG. 2 illustrates a map of the surface roughness expressed in Haze measured by means of a piece of KLA Tencor SP2 inspection equipment on an SOI structure against which the negative substrate presented a "cleavage line" type defect.

In this figure, a line is found that results from the support of the "damaged" negative substrate facing the positive substrate (that will provide the SOI structure) before separation of the substrates.

However, the Applicant has observed that this "cleavage line" has not altered the propagation of detachment waves. The Applicant has deduced that the detachment took place correctly with the exception of the appearance of this "cleavage line."

This tends to indicate that the "cleavage line" defect does not prevent transfer from the SOI surface of a donor substrate to a receiver substrate from being performed.

The Applicant has thus deduced that the "cleavage line" type defect probably appears at the end of the separation annealing and is connected to the thermal constraints undergone at the end of annealing.

In fact, in FIGS. 1a and 1b, the lines observed on the positive substrate have not traversed the transferred layer. During the observation of these defects, the Applicant observed that they are essentially comprised of particles issued from the "break" in the negative substrate.

Thus, in the context of the invention, limiting the thermal constraints undergone by the structure during the end of its separation annealing is proposed.

Preliminarily, it will be noted that due to industrial constraints, the invention seeks to not lengthen the duration of the thermal annealing (and thus the duration of the method) compared to the conventional annealing known to the person skilled in the art.

In annealing from the prior art, it is customary to fix a temperature setting for the furnace to reach (for example on the order of 200° C., measured by temperature sensors placed at the bottom of the structure composed of the positive substrate and the negative substrate) and to wait until this temperature is reached before passing to the next step. The following step is the opening of the furnace for unloading the structure.

However, when the furnace is opened, although the measured furnace temperature is 200° C., the temperature of the substrates contained in the furnace may be higher. This is due to the molecular dynamics of the substrates cooling that is generally slower than the cooling of the furnace atmosphere (the differential being due to, in particular, the thermal inertia of the structures plus support assembly). Thus, opening the furnace leads to imposing a first thermal shock on the structures, which are at a high real temperature. In addition, opening the furnace door thus leads to the measured temperature of the furnace being lowered to under the temperature setting, and the furnace temperature regulation tends to start phasing in furnace heat in order to maintain the temperature at the temperature setting; this would impose a second thermal shock on the structures.

These two thermal shocks lead to the formation of inhomogeneity of the temperature distribution at the surface of the structures (that may be expressed by "gradient," the term "gradient" being in the present text understood to refer to a spatial gradient on the surface of a substrate).

The Applicant has realized that this inhomogeneity of temperature at the surface of the separated substrates when the furnace was opened probably was connected to the appearance of the cleavage line on the separated substrates.

In the context of the invention, the invention seeks to reduce the thermal constraints undergone by the structure during the end of its thermal separation annealing and particularly when the structure is removed from the furnace in view of limiting "cleavage line" defects.

More precisely, separation annealing, and still more precisely, its second phase during which the temperature decreases, will be regulated so as to minimize temperature inhomogeneities at the surface of the substrates separated when the furnace is opened.

In this respect, one may, according to a first embodiment, regulate this second annealing phase not in temperature, as is usually done, but in duration.

According to a second embodiment, one may regulate the second annealing phase in temperature but with an extremely low temperature setting—for example on the order of 50° C.—in such a way that this temperature is too low to be reached in practice.

In this second embodiment, the separation annealing will be interrupted at the end of a given duration and, in any case, well before the real temperature has decreased to the temperature setting value.

In fact, when the furnace is opened to unload the structure, the structure presents a low temperature with a low temperature gradient, which has the consequence of limiting the appearance of "cleavage line" defects.

In the context of the invention, the invention thus sees to it that the substrates leaving the furnace do not undergo the effects of power bursts from the furnace, when the furnace seeks to regulate its temperature.

Figure 4:
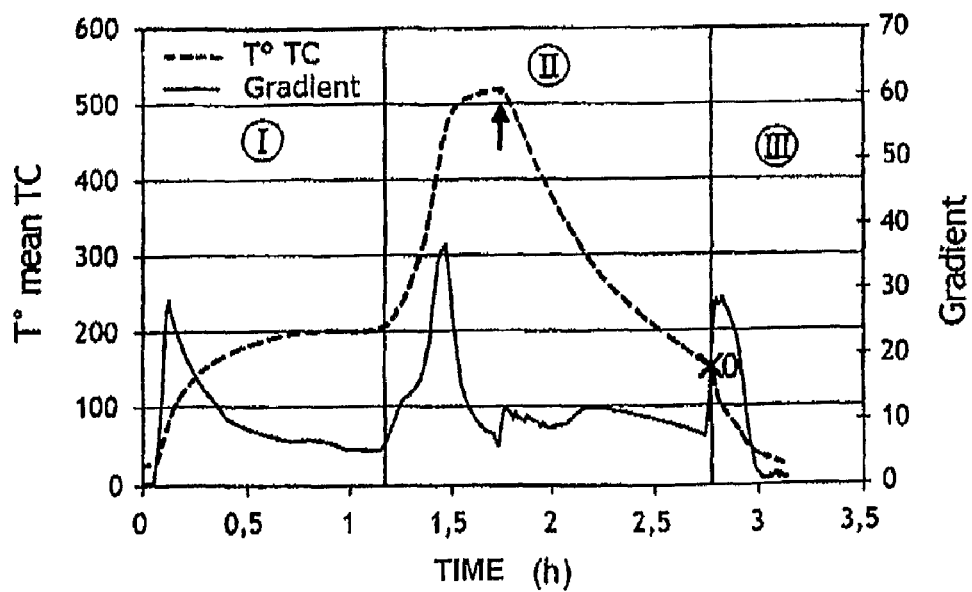
FIG. 4 is a graph similar to that of FIG. 3 for separation annealing according to the invention.

FIGS. 3 and 4 illustrate the average temperature (dotted lines) measured on the structure in the furnace and the temperature gradient (solid lines) for conventional annealing and annealing of the invention, respectively.

Thermal separation annealing is comprised of three periods, the first period corresponds to preconditioning of the bonding interface (period not discussed).

Period II presents two phases:
  a first phase during which the temperature increases allowing a high temperature to be reached and stabilizing the annealing at this high temperature and,
  a second phase during which the temperature changes along a downgrade and after which the furnace will be opened.

After the second phase, the substrates are unloaded.

It is specified that in the present text, "high temperature" is understood to be on the order of 500° C.

Period III is a downgrade since at this time the structure is leaving the furnace and the structure continues to cool outside the furnace (area not discussed).

In FIGS. 3 and 4, the time the furnace is opened for unloading, carried out at the end of the second phase, is represented by "O."

It appears from FIG. 3 (solid lines) that in the case of known type thermal separation annealing, the temperature gradient, when the furnace is opened, undergone by the structure is considerable: approximately 70° C. resulting from strong variations in the structure when the furnace is opened.

As a reminder, here temperature "gradient" is understood to refer to the spatial gradient on the surface of the substrates.

In the case of FIG. 3, the furnace setting is 200° C. and when the furnace is opened, the temperature of the structure is higher than 200° C. (approximately 250° C.).

In this case, the temperature of the structure is too high and, in addition, the structure undergoes thermal bursts, which leads to a "cleavage line" defect, as illustrated in FIGS. 1a, 1b and 2.

In the case of separation annealing of the invention, the period of the second phase and the temperature setting of the furnace during the second separation annealing phase is defined to see that when the structure is unloaded from the furnace, the temperature of the structure is minimal, with a low gradient.

The invention thus specifies that the furnace is opened, not when the furnace has reached a previously set temperature, but after a duration.

In the case where the furnace must operate with a temperature setting, in order to avoid the disadvantages of known separation annealings, this temperature is set at a temperature lower than that used in known separation annealings. In this case, in practice the temperature setting is set at a very low value which will not be reached since the annealing will be interrupted beforehand.

Thus, in the case of thermal separation annealing of the invention, in a non-limiting manner, the temperature setting of the furnace is low enough to not have been reached at the end of the second phase of the thermal separation annealing.

For example, the temperature setting of the furnace may be set at 50° C.

It should be specified that this low temperature will not be reached by the furnace when the furnace is opened at the end of the second phase of period II.

The temperature of the structure when the furnace is opened is, for example, less than 200° C.

The duration of the second phase during which the temperature decreases will tend to be longer (see FIG. 4) than the duration of this same phase found in known annealings (see FIG. 3).

Consequently, it appears that in the case of thermal separation annealing of the invention, the part of the separation annealing during which cooling of the structure takes place is favored.

In addition, in order to maintain a constant annealing duration (so as to not increase the duration of the method) while promoting cooling of the structure (that is, period II), the temperature setting is lowered.

The speed of the temperature reduction may, for example, be on the order of 10° C. per minute.

Thus, thermal annealings according to the invention (see FIG. 4) may be conducted without lasting longer than thermal separation annealings from the prior art in conformance with the industrial constraints.

In addition, during the thermal annealing, gas is injected in the furnace and more precisely on the substrates. This gas is typically Nitrogen or Argon.

In period II of the thermal separation annealing, the gas stream is 12 slm (standard liter per minute). By way of indication, it should be noted that 1 slm=1.666 $10^{-5}$ $m^3 \cdot s^{-1}$.

This gas stream passes from 12 slm to 20 slm when the furnace is opened.

This increase in the gas stream promotes cooling of the structure.

By referring again to FIG. 4 (see solid lines) it appears that the thermal constraints undergone by the structure exiting the furnace were reduced in comparison with the establishment of a known type of annealing (see FIG. 3).

In fact, at the furnace exit when the structure is exiting the furnace, its average temperature is 150° C. and the temperature gradient is then only 28° C., because of this small variations in temperature result.

It was remarked that the establishment of separation annealing according to the invention would reduce "cleavage line" defects by a factor of two.

More precisely, it was observed that in terms of yield for the same type of structure, the number of lots impacted by the "cleavage line" defect would pass from 14% to practically 7%.

Thus, "cleavage line" defects were spectacularly reduced by establishing thermal annealing as described.

In addition, the method of the invention enables "cleavage line" defects on structures formed from substrates with diameters equal to or greater than 300 mm to be reduced. In fact, the "cleavage line" defect problem appears especially when the substrates have large diameters (equal to or greater than 300 mm).

Furthermore, it also follows from the results obtained by the establishment of thermal annealing as described that the costs incurred by such methods are reduced.

In fact, since the "cleavage line" defect was reduced, the number of residual substrates recycled increased.

In addition, in the case where the residual substrate would break, a manual intervention was necessary to extract residual debris from the furnace.

In the context of the invention, given that the number of negative substrates that "break" is reduced, one may do without this intervention, which contributes to better yield of the method.

Beyond the "cleavage line" defect, it was observed that promoting cooling of the structure and thus reducing the structure unloading temperature allows the final defectivity, typically measured with a piece of KLA Tencor SP2 type equipment, on the SOI to be reduced.

"Tearing-off" type defects measured on SOI were considerably reduced.

In addition, "zone not transferred" type defects measured on SOI were reduced.

FIGS. 5a and 5b illustrate maps of defects presenting tearing-off type defects by respectively using conventional annealing and annealing from the invention.

It clearly appears that tearing-off type defects—particularly on the edges of the structure—have been considerably reduced.

In addition, with thermal separation annealing of the invention, an improvement in the final defectivity was observed, as illustrated in FIG. 6.

In FIG. 6, a volume of SOI wafers benefiting from the proposed thermal separation annealing of the invention is compared to a reference volume, under the same conditions, on the same types of equipment and in the same time interval, but with a known type of separation annealing.

FIGS. 6a and 6b respectively compare the particular defectivities at 0.15 µm and 0.50 µm recorded with a piece of KLA Tencor SP2 type equipment on these two SOI structure volumes.

For the two types of particular defectivities with annealing from the invention, the discrepancy between the minimum value and the maximum value of the number of defectivities has reduced (between box plots 61 and 62 for particular defectivities at 0.15 µm and between box plots 63 and 64 for particular defectivities at 0.50 µm).

In particular, the surface of the structure issued from the detachment presents on average a number of particular defectivities at 0.15 µm and 0.50 µm on the order of 7 and 3, respectively.

Thus, it clearly appears that by using thermal separation annealing from the invention, the number of particular defectivities has been substantially reduced.

FIG. 6c illustrates the occurrence of "cluster" type defects, that is, tearing-off defects at the center of the structure calculated from SP2 measurements via a dedicated algorithm.

The example described focuses on SOI structures; of course the person skilled in the art may easily transpose the present invention to other types of structures that may be obtained via Smart Cut™ type methods.

What is claimed is:

1. In a method of detaching two substrates at an embrittlement zone situated at a given depth in one of the two substrates to form a detached surface on each substrate, the improvement which comprises:

conducting a two-phase separation annealing in a furnace, including a first annealing phase during which the substrates experience changes in temperature along an upgrade to a high temperature wherein the annealing is stabilized and continued to cause separation of the substrates, followed by a second annealing phase during which the substrates experience changes in temperature along a downgrade to an end point at which the furnace is opened for unloading of the substrates, with the second annealing phase conducted and regulated to minimize temperature inhomogeneities on the detached surfaces of the substrates when the furnace is opened.

2. The method of claim 1, wherein the second annealing phase includes a period defined by a duration setting and the inhomogeneities that are minimized are cleavage defects.

3. The method of claim 1, wherein, during the second annealing phase, the temperature in the furnace is regulated to change to a target temperature that is low enough to have not been reached at the end of the second phase.

4. The method of claim 3, wherein the target temperature is on the order of 50° C.

5. The method of claim 1, wherein during unloading, the temperature of the substrates is less than 200° C.

6. The method of claim 1, which further comprises injecting a gas stream on the substrates according to a fixed rate.

7. The method of claim 6, wherein the gas is Nitrogen or Argon.

8. The method of claim 7, wherein the gas stream is injected at a rate on the order of 12 slm before the furnace is opened.

9. The method of claim 6, wherein the gas stream is injected at a rate on the order of 20 slm at the end of the second annealing phase.

10. The method of claim 1, wherein the high temperature is on the order of 500° C.

11. The method of claim 1, wherein, during the second annealing phase, the temperature decreases at a speed of 10° C. per minute.

12. The method of claim 1, wherein the embrittlement zone is made by implanting ions.

13. The method of claim 1, wherein the substrate has a diameter is equal to or greater than 300 mm.

14. The method of claim 1, wherein (a) the high temperature is on the order of 500° C., (b) during the second annealing phase, the temperature in the furnace is regulated to a target temperature on the order of 50° C. and the temperature decreases at a speed of 10° C. per minute, and (c) during unloading, the temperature of the substrates is less than 200° C.

15. The method of claim 14, which further comprises injecting a gas stream of Nitrogen or Argon on the substrates for cooling, with the gas stream injected at a rate of between about 12 slm and 20 slm.

* * * * *